(12) United States Patent
Maeda

(10) Patent No.: US 6,429,717 B1
(45) Date of Patent: Aug. 6, 2002

(54) RECEIVING CIRCUIT

(75) Inventor: Tadashi Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/956,355

(22) Filed: Sep. 19, 2001

(30) Foreign Application Priority Data

Sep. 19, 2000 (JP) ........................................ 2000-283180

(51) Int. Cl.[7] ................................................ H03L 5/00
(52) U.S. Cl. ...................................... 327/333; 327/543
(58) Field of Search ........................... 327/45, 205, 206, 327/333, 541, 543

(56) References Cited

U.S. PATENT DOCUMENTS

| 5,592,111 A | * | 1/1997 | Wong et al. | ................ | 327/291 |
| 6,121,806 A | * | 9/2000 | Kono et al. | ................. | 327/205 |
| 6,229,753 B1 | * | 5/2001 | Kono et al. | ............ | 365/189.11 |

FOREIGN PATENT DOCUMENTS

| JP | 5-46366 | 12/1993 |
| JP | 10-275038 | 10/1998 |

OTHER PUBLICATIONS

"Partial Response Detection Technique for High–Speed Chip–to–Chip Communications", Hirotaka Tamura, et al., IECE C–II, vol. J82–C–II, No. 5, pp. 239–246 (1999).

* cited by examiner

Primary Examiner—Timothy P. Callahan
Assistant Examiner—Linh Nguyen
(74) Attorney, Agent, or Firm—Scully, Scott, Murphy & Presser

(57) ABSTRACT

A receiving circuit for receiving a signal transmitted to a signal transmission path, the receiving circuit comprising: a signal potential detection means for detecting signal potential of the received signal, a signal logic value discrimination means for discriminating a logic value of the received signal, and a reference signal generation means for generating a reference signal for the signal logic value discrimination means, based on a signal potential detected by the signal potential detection means and a discrimination result of the signal logic value discrimination means.

12 Claims, 13 Drawing Sheets

Fig. 3(a)

LOGIC VALUE DISCRIMINATION CIRCUIT (DFF1)=H
SIGNAL POTENTIAL DETECTION CIRCUIT (DFF2)=H
TWO POSSIBLE REFERENCE POTENTIAL LEVELS (RH LEVEL OR RM LEVEL)
TWO POSSIBLE SIGNAL POTENTIAL LEVELS (H LEVEL OR HM LEVEL)

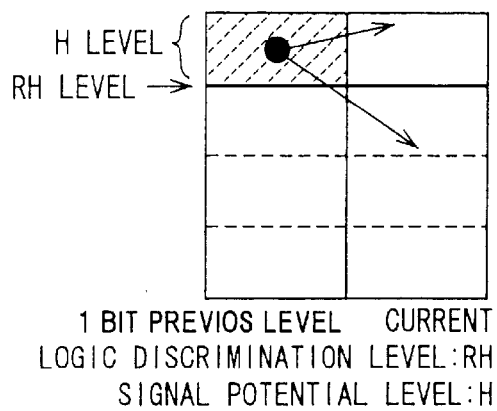

1 BIT PREVIOS LEVEL    CURRENT
LOGIC DISCRIMINATION LEVEL:RH
SIGNAL POTENTIAL LEVEL:H

Fig. 3(b)

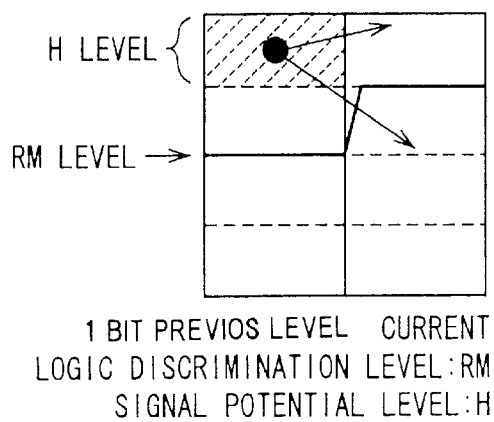

1 BIT PREVIOS LEVEL    CURRENT
LOGIC DISCRIMINATION LEVEL:RM
SIGNAL POTENTIAL LEVEL:H

Fig. 3(c)

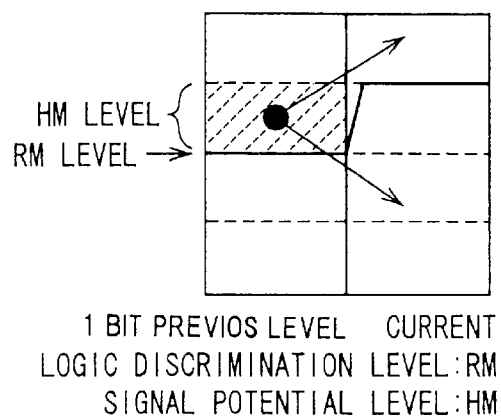

1 BIT PREVIOS LEVEL    CURRENT
LOGIC DISCRIMINATION LEVEL:RM
SIGNAL POTENTIAL LEVEL:HM

Fig. 4

LOGIC VALUE DISCRIMINATION CIRCUIT (DFF1)=L
SIGNAL POTENTIAL DETECTION CIRCUIT (DFF2)=H
RH IS THE ONLY POSSIBLE LOGIC DISCRIMINATION LEVEL
HM IS THE ONLY POSSIBLE SIGNAL POTENTIAL LEVEL

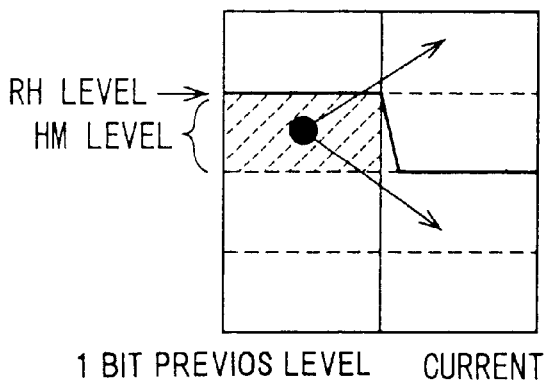

Fig. 5

LOGIC VALUE DISCRIMINATION CIRCUIT (DFF1)=L
SIGNAL POTENTIAL DETECTION CIRCUIT (DFF2)=L
RL IS THE ONLY POSSIBLE LOGIC DISCRIMINATION LEVEL
LM IS THE ONLY POSSIBLE SIGNAL POTENTIAL LEVEL

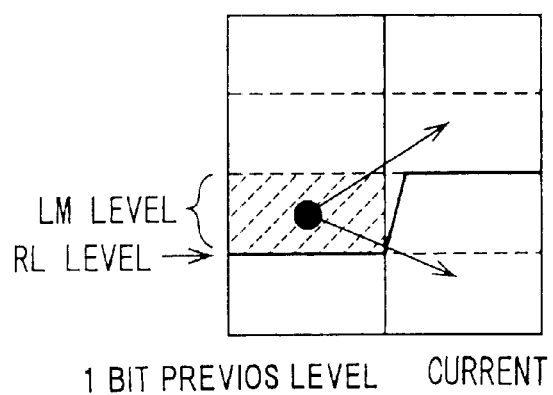

LOGIC VALUE DISCRIMINATION CIRCUIT (DFF1)=L
SIGNAL POTENTIAL DETECTION CIRCUIT (DFF2)=L
TWO POSSIBLE REFERENCE POTENTIAL LEVELS (RM LEVEL OR RL LEVEL)
TWO POSSIBLE SIGNAL POTENTIAL LEVELS (LM LEVEL OR L LEVEL)

Fig. 6(a)

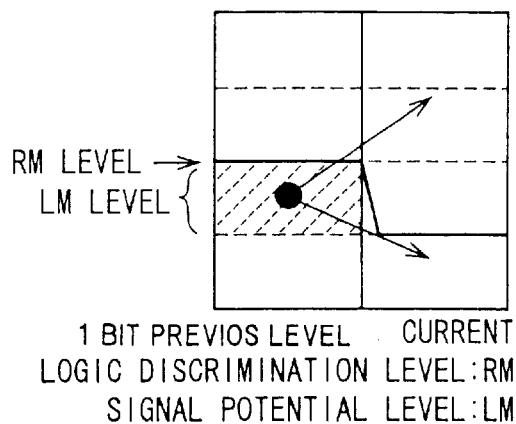

1 BIT PREVIOS LEVEL    CURRENT
LOGIC DISCRIMINATION LEVEL:RM
SIGNAL POTENTIAL LEVEL:LM

Fig. 6(b)

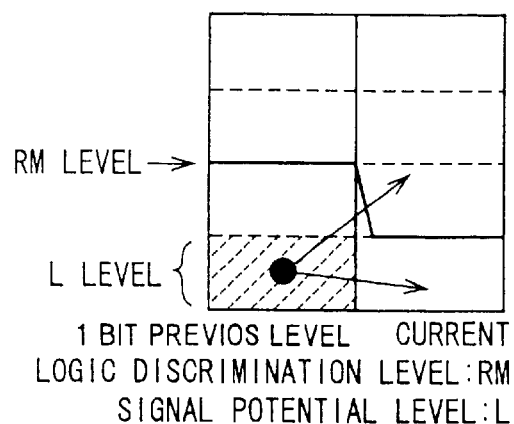

1 BIT PREVIOS LEVEL    CURRENT
LOGIC DISCRIMINATION LEVEL:RM
SIGNAL POTENTIAL LEVEL:L

Fig. 6(c)

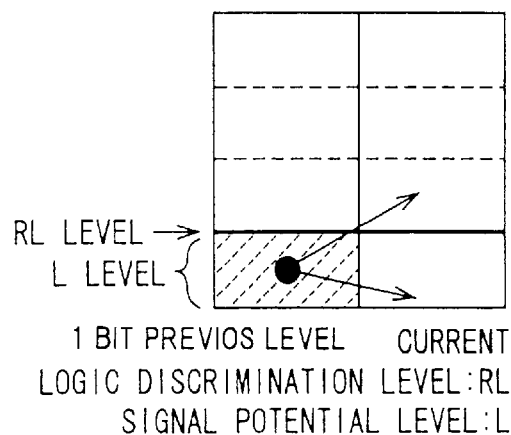

1 BIT PREVIOS LEVEL    CURRENT
LOGIC DISCRIMINATION LEVEL:RL
SIGNAL POTENTIAL LEVEL:L

Fig. 14(a)
PRIOR ART
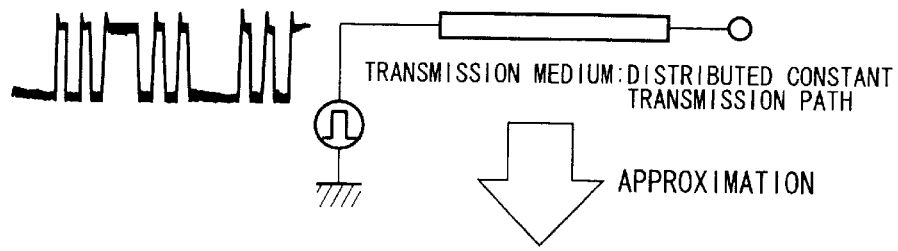
TRANSMISSION MEDIUM: DISTRIBUTED CONSTANT TRANSMISSION PATH
⇩ APPROXIMATION
TRANSMISSION MEDIUM: LUMPED CONSTANT TRANSMISSION PATH
Fig. 14(b)
PRIOR ART
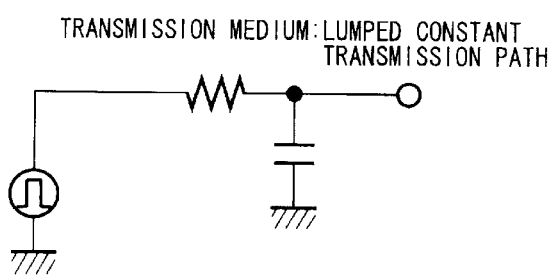
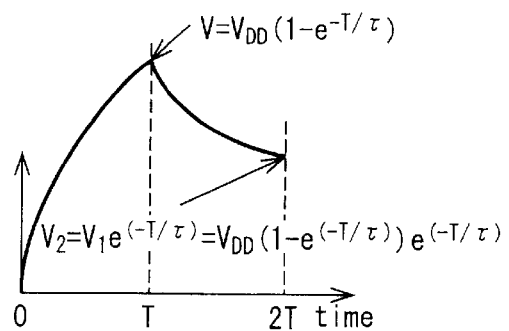
$V = V_{DD}(1 - e^{-T/\tau})$
$V_2 = V_1 e^{(-T/\tau)} = V_{DD}(1 - e^{(-T/\tau)}) e^{(-T/\tau)}$
Fig. 15
PRIOR ART
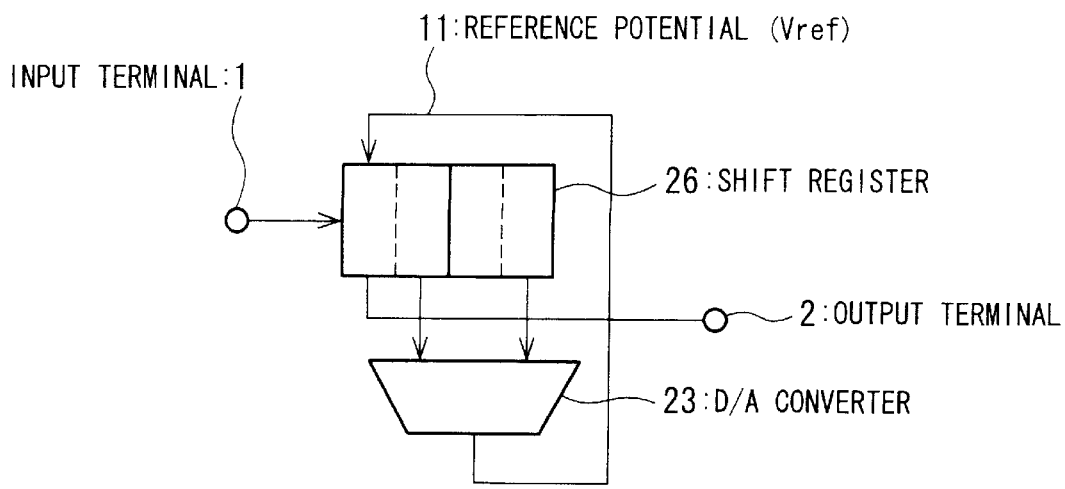
INPUT TERMINAL: 1
11: REFERENCE POTENTIAL (Vref)
26: SHIFT REGISTER
2: OUTPUT TERMINAL
23: D/A CONVERTER

Fig. 17(a)
PRIOR ART
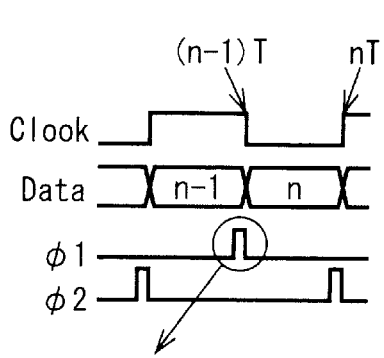
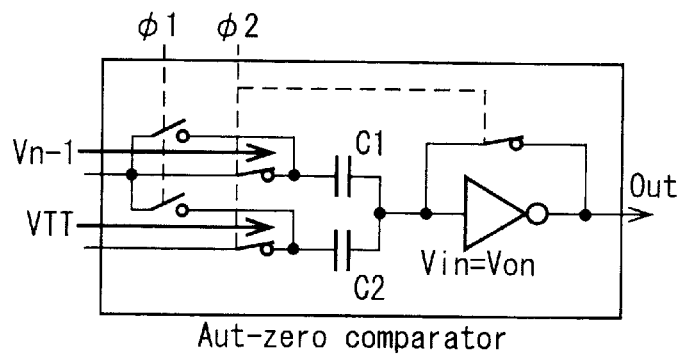
$\phi 1$="high"
- $V_{n-1}$ and VTT sampled
- Auto-zeroing performed
Fig. 17(b)
PRIOR ART
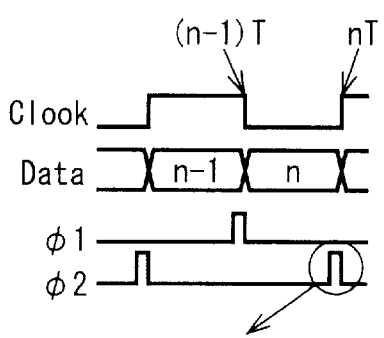
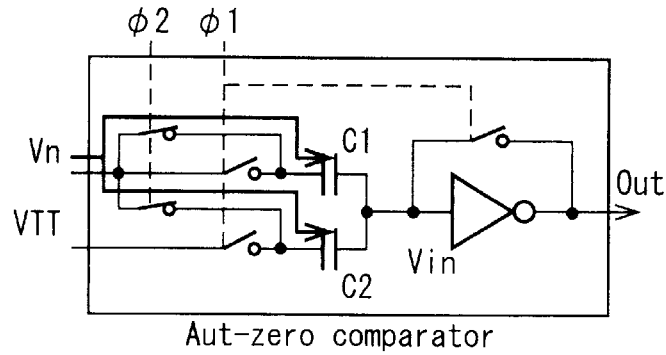
$\phi 2$="high"
- Symbol determined
- |S| generatod and aubtracted

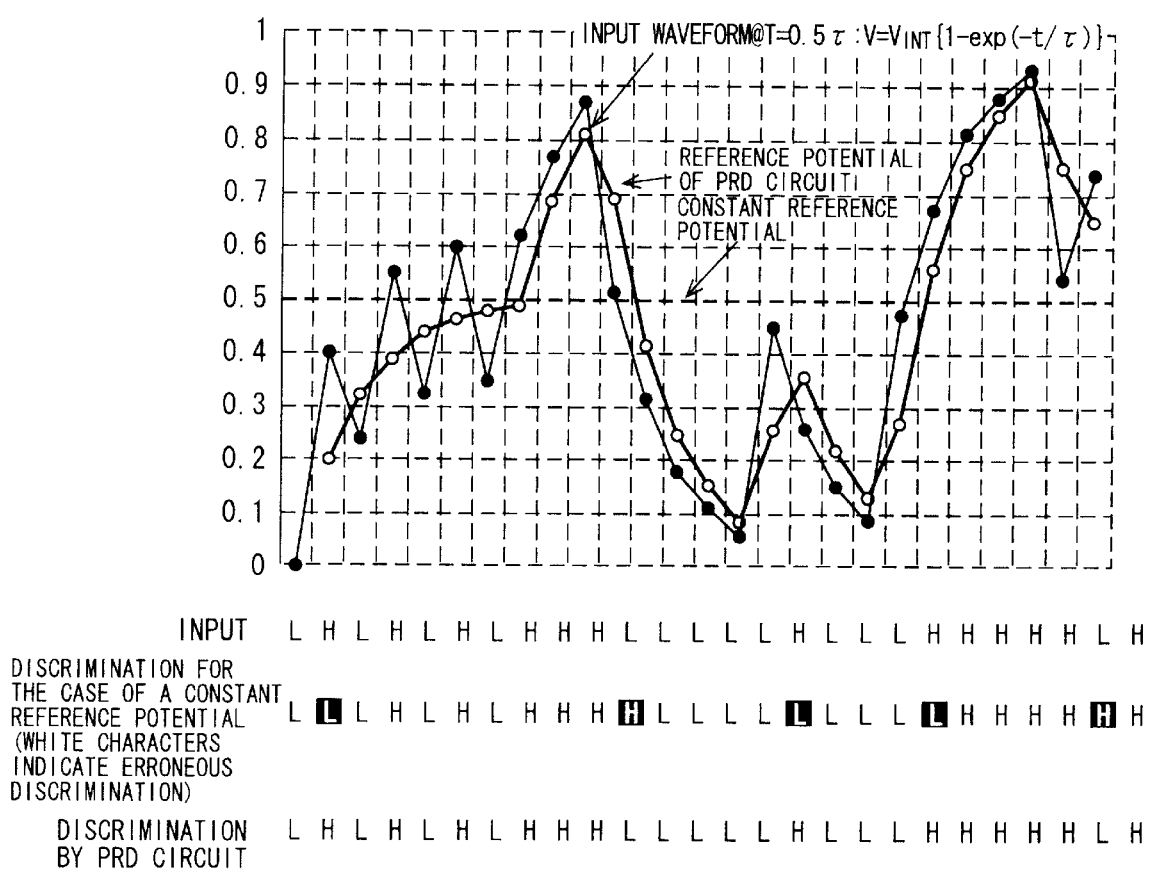

RECEIVING CIRCUIT

BACKGROUND OF THE INVENTION

1. Field of the Invention

The present invention relates to a receiving circuit of a signal transfer system and a semiconductor device in which the signal transfer system is applied, and more particular it relates to a receiving circuit of a signal transfer system performing signal transfer between LSI chips, between modules, and between a plurality of circuits within one and the same LSI chip, and to a semiconductor device in which this signal transfer system is applied.

2. Related Art

In recent years, there has been a demand for signal transfer with a high speed between, for example, a DRAM and a processor, or between circuits within a single semiconductor integrated circuit. The reason for this is that, with a dramatic improvement in the operating speed of CMOS LSI devices in recent years, microprocessors with clock frequencies exceeding 1 GHz being reported, the processing speed of equipment making use of these high-speed LSI devices has come to be restricted by the transfer speed between circuit boards, and between chips.

For example, in a personal computer in order to improve the signal processing speed from a DRAM to a processor, the improvement of the parallel transfer rate per pin to the gigabit level and beyond is being studied. In order to send such as high-speed signal outside the chip, it is necessary to take measures with respect to the significant deterioration of a signal waveform from the ideal transmitted signal waveform caused by attenuation and reflection in the transmission path, including the package and connectors.

FIG. 14 of the accompanying drawings shows a receiving end waveform of a signal transmitted on a transmission path. The transmitted signal undergoes multiple reflections along the transmission line and attenuation, the result being that a certain amount of time is required to reach the potential at the transmitting end. Given this situation, let us assume that the transmission path can be approximated by a circuit made up of lumped constants, in which the bit length of the transmitted signal is T, and the time constant of the transmission line is $\tau$. In the example shown in the drawing, the bit length T is shorter than the time constant of the transmission path (T<$\tau$), in response to data changes (time slot "n"), data undergoes a new change (time slot "n+1") at time T during which the signal voltage at the receiving end is changing. If the potential at the time n+1 is V(n+1) and the potential at the time n is V(n), because the potential change can be expressed by the relationship $V(n+1)=V(n)(1-\exp(-T/\tau))$, in the case in which the time constant of the transmission path is longer than the bit length of the transmitted signal, it can be seen that there is a large change in the signal at the receiving end because of the influence of the past logic state of the signal. In particular in the case in which the transmitted signal remains at the 0 or 1 state continuously, with a subsequent single-bit reversal to the other logic state, the received signal does not reach a logic signal level enabling sufficient discrimination by a discrimination circuit, thereby resulting in an erroneous judgment by the discriminating circuit.

In order to solve such problems, one method is to simply use a transmission medium having superior high-frequency characteristics. Such a transmission medium, however, generally not only has a high cost, but also requires a large amount of mounting space, thereby resulting in the problem of an increased size of the system. As shown in the Japanese unexamined patent publication (KOKAI) No.10-275038, the Japanese Utility Model (KOKOKU) No.5-46366 and IECE C-II, Vol. J82-C-II, No. 5 pp. 239–246, there is a method of storing the past signal states in shift registers or the like, and applying weighting to these information to change the level of a reference signal. The circuit configuration in disclosed in the above-mentioned IECE C-II, Vol. J82-C-II, No. 5 pp. 239–246 is shown in FIG. 15. Because the results of a judgment made by the first latch stage of the receiving circuit are successively stored into a shift register, the each output bit of the shift register represents the past received signal. In the example shown in the drawing, a 2-bit shift register 26 is used to store past signal information, this information being used for changing the level of a reference signal, using a D/A converter 23 to act as a weighting circuit. The first latch stage of the shift register has a differential circuit configuration that performs a comparison with a reference signal and a received signal, to be described later, and the output of this latch circuit is the output of the receiving circuit. The weighting circuit in this example is a circuit which outputs an average value of a plurality of signals.

To simplify the description of the operation of the circuit of FIG. 15, consider the case in which signal information for the immediately previous two bits is not weighted. In this case, if the two bit previous signals and one bit previous signal are both at the 0 level, the weighting circuit outputs a low level as the reference potential. If the either one of two bit previous signals and one bit previous signal is at the 1 level and the other is at the 0 level, the reference potential would be an intermediate potential, and if the two bits previous signals and one bit previous signal are both at the 1 level, the reference potential would be at the high level.

FIG. 16 of the accompanying drawings shows the signal waveform at the receiving end, the logic discrimination reference voltage of this circuit, the logic value at the transmitting end, and the logic value judged by this circuit, for the case in which the data period T is 0.5$\tau$. It can be seen that, although the signal waveform is considerably deteriorated at the receiving end, because the reference signal used for logic discrimination is set to the average value of a past data series, a potential appropriate for logic discrimination is achieved, making it possible to receive the signal without erroneous logic level discrimination. In this drawing, the potential in which the reference voltage is constant is shown. The white characters on black background in FIG. 16 indicates erroneous discrimination.

In the example of this circuit, the change in level of the reference signal is 1/4 of the signal amplitude, and in the case of a transmission medium having poor frequency characteristics, it is necessary to adjust for an even narrower signal level. To make a finer signal adjustment, it is necessary to increase the number of level shift register stages and input each output bit thereof to a weighting circuit. For example, in the case of using a 3-bit shift register, it is possible to establish 5 levels of reference potential.

Using this method, there is the drawback that, if the number of shift register stages is made large and the reference signal level is controlled even more finely, if even one erroneous discrimination occurs, this erroneous discrimination will continue for a long period.

In order to avoid this problem, a configuration as shown in FIG. 17 of the accompanying drawings has been proposed. This circuit uses two RZ signals, performs analog storage of the 1-bit previous signal level into a capacitor, and subtracts the 1-bit previous signal level from the current signal level, so as to eliminate the influence of the past signal, and it performs logic level discrimination. The operation of this circuit is described below, with reference made to FIG. 17.

In the case in which the clock signal φ1 is at a high level, the input voltage Vn−1 in the receiving circuit at the time "n−1" and the reference potential VTT are received by the capacitors C1 and C2, simultaneously with which the input and output of an inverter are shorted (FIG. 17 (a)). The output potential of the inverter with the input and output thereof shorted is the logic threshold of that inverter. Next, in the case in which φ2 is at the high level, the input voltage Vn at the time n is sampled via the capacitors C1 and C2 (FIG. 17 (b)). If these capacitances of the capacitors C1 and C2 are set so that C1/(C1+C2)=exp(−T/τ), the voltage appearing across the parallel capacitance of C1 and C2 is a voltage that corresponds to the influence of the past signal. Because these capacitors are provided in series with the input of the receiving circuit inverter, the automatic subtraction operation is performed, even if there is only a very small change in signal potential at the receiving end of the transmission path, thereby it is possible to perform accurate logic discrimination.

FIG. 18 of the accompanying drawings shows the signal waveform at the receiving end, the logic discrimination reference voltage of this partial response detector circuit (PRD), the logic value at the transmitting end, and the logic value judged by this circuit, for the case in which the data period T is 0.5τ. It can be seen that, although the signal waveform is considerably deteriorated at the receiving end, because the reference signal used for logic discrimination is set to an intermediate value between the 1 bit previous signal and the current signal potential, it is possible to receive the signal without erroneous logic level discrimination.

In a system that stores a potential level in a capacitance so as to cause the generation of an ideal reference potential as described above, it is necessary to have a high-speed RZ signal, and the RZ signal generation circuit becomes the governing factor in determining the overall speed of the LSI device. Accordingly, it is necessary to use basic elements having high-frequency characteristics. Additionally, because variation in the capacitance values formed as part of the LSI device directly influences the logic discrimination reference potential, precise control for fabricating of this capacitance is required.

Accordingly, it is an object of the present invention to solve the above-described drawbacks in the related art, by providing a novel receiving circuit using relatively little past data, such as 1 or 2 bits, capable of generating a reference potential with a simple clock signal.

SUMMARY OF THE INVENTION

To achieve the above-noted objects, the present invention adopts the following described technical constitution.

The first aspect of the present invention is a receiving circuit for receiving a signal transmitted to a signal transmission path, the receiving circuit comprising: a signal potential detection means for detecting signal potential of the received signal, a signal logic value discrimination means for discriminating a logic value of the received signal, and a reference signal generation means for generating a reference signal for the signal logic value discrimination means, based on a signal potential detected by the signal potential detection means and a discrimination result of the signal logic value discrimination means.

The second aspect of the present invention is that the signal logic value discrimination means comprising a comparator for comparing a potential of the received signal with that of the reference signal and for discriminating a level of the received signal.

The third aspect of the present invention is that the signal potential detection means holds discriminated logic levels of the received signal from a prescribed past time to the present time, and the reference signal generation means generates a reference potential of the reference signal for performing next logic discrimination of a received signal in the signal logic value discrimination means, based on data stored in the signal potential detection means.

The fourth aspect of the present invention is that the signal logic value discrimination means holds discriminated logic levels of the received signal from a prescribed past time to the present time, and the reference signal generation means generates a reference potential of the reference signal for performing next logic discrimination of a received signal, based on data stored in the signal logic value discrimination means.

The fifth aspect of the present invention is that the signal potential detection means holds detected signal levels of the received signal from a prescribed past time to the present time, and the signal logic value discrimination means holds discriminated logic levels of the received signal from a prescribed past time to the present time, the reference signal generation means generates a reference potential of the reference signal for performing next logic discrimination of a received signal in the signal logic value discrimination means, based on data stored in the signal potential detection means and the signal logic value discrimination means.

The sixth aspect of the present invention is that the signal logic value discrimination means comprising a comparator for comparing the received signal with the reference signal, and a first flip-flop circuit for latching comparison results thereof, the signal potential detection means comprising a comparator for comparing the received signal with a fixed potential, and a second flip-flop circuit for latching comparison results thereof, and the reference signal generation means comprising a D/A converter for applying weighting to signals output from the first flip-flop circuit and the second flip-flop circuit, and generating a reference potential of the reference signal.

The seventh aspect of the present invention is that the signal logic value discrimination means comprising a comparator for comparing the received signal with the reference signal, and at least one shift register connected to the first comparator, the signal potential detection means comprising a comparator for comparing the received signal with a fixed potential, and a flip-flop circuit for latching comparison results thereof, and the reference signal generation means comprising a D/A converter for applying weighting to signals output from the shift register and the flip-flop circuit, and generating a reference potential of the reference signal.

The eighth aspect of the present invention is that the signal logic value discrimination means comprising a comparator for comparing the received signal with the reference signal, a first flip-flop circuit for latching comparison results thereof, and a plurality of shift registers connected in series to the first flip-flop circuit, the signal potential detection means comprising a comparator for comparing the received signal with a prescribed potential, and a second flip-flop circuit for latching comparison results thereof, and the reference signal generation means comprising a D/A converter for applying weighting to signals output from the shift registers and the second flip-flop circuit, and generating a reference potential of the reference signal.

The ninth aspect of the present invention is that the signal logic value discrimination means comprising a comparator for comparing the received signal with the reference signal, and a flip-flop circuit for latching comparison results thereof, the signal potential detection means comprising an A/D converter for detecting a level of the received signal, and the reference signal generation means comprising an D/A converter for applying weighting to the signal detected by the A/D converter and generating a reference potential of the reference signal.

The tenth aspect of the present invention is that the signal logic value discrimination means comprising a comparator for comparing the received signal with the reference signal, and a first flip-flop circuit for latching comparison results thereof, the signal potential detection means comprising a plurality of prescribed potentials which are different each other, a plurality of comparator for comparing the received signal with the fixed potential, and a plurality of second flip-flop circuits for latching each of the comparison results, and the reference signal generation means comprising a D/A converter for applying weighting to signals output from the first flip-flop circuit and the second flip-flop circuits and generating a reference potential of the reference signal.

The eleventh aspect of the present invention is that a step width of the reference signal is established to be fine in the vicinity of a center point of an amplitude of the received signal in a full swing condition, and the step width is established to be widened in directions of a lowest value and a highest value.

The twelfth aspect of the present invention is that, if a step width of the reference signal is $\Delta V$, a number of steps of the reference signal is M, discrimination level of each step is $V_{TH}(n)$ (1<n=M-1), a time constant in a case of approximating the signal transmission path with a lumped constant is $\tau$, a data bit length is T, and an amplitude of the received signal in a full-swing condition is Vfullsw, the step width $\Delta V$ and each discrimination level $V_{TH}(n)$ satisfy the following condition, $\Delta V < \text{Min.} [(Vfullsw - V_{TH}(n))(1-\exp(-T/\tau)), V_{TH}(n)(1-\exp(-T/\tau))]$.

BRIEF DESCRIPTION OF THE DRAWINGS

FIG. 3(a) is a drawing illustrating the operating principle of the circuit of FIG. 2.

FIG. 3(b) is a drawing illustrating the operating principle of the circuit of FIG. 2.

FIG. 3(c) is a drawing illustrating the operating principle of the circuit of FIG. 2.

FIG. 4 is a drawing illustrating the operating principle of the circuit of FIG. 2.

FIG. 5 is a drawing illustrating the operating principle of the circuit of FIG. 2.

FIG. 6(a) is a drawing illustrating the operating principle of the circuit of FIG. 2.

FIG. 6(b) is a drawing illustrating the operating principle of the circuit of FIG. 2.

FIG. 6(c) is a drawing illustrating the operating principle of the circuit of FIG. 2.

FIG. 14(a) is a drawing illustrating waveform deterioration caused by the transmission path.

FIG. 14(b) is a drawing showing waveform received at the receiving end of the transmission path.

FIG. 15 is a drawing showing a circuit of the prior art.

FIG. 17(a) is a drawing illustrating the operating principle of the prior art.

FIG. 17(b) is a drawing illustrating the operating principle of the prior art.

FIG. 18 is a timing diagram illustrating the operation of the circuit of FIG. 17.

DETAILED DESCRIPTION OF THE PREFERRED EMBODIMENTS

Embodiments of a receiving circuit of a signal transmission system according to the present invention are described in detail below, with references made to relevant accompanying drawings.

(First Embodiment)

Figure 1:
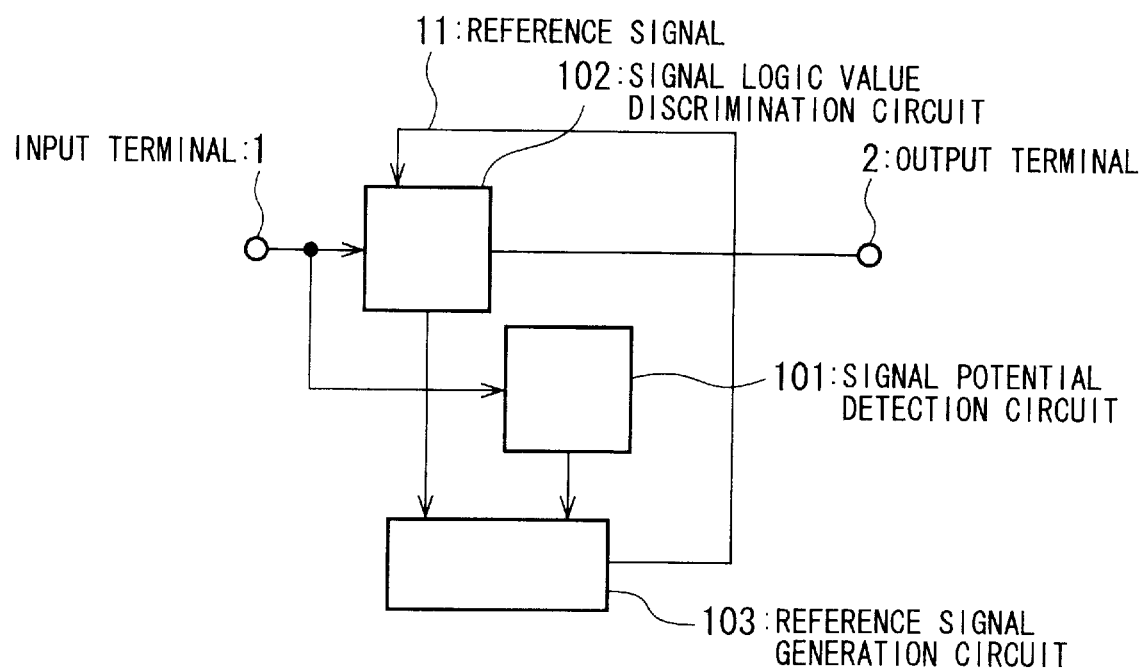
FIG. 1 is a circuit diagram showing a first embodiment of the present invention.

FIG. 1 shows a first embodiment of the present invention. In this drawing, the reference numeral 101 denotes a signal potential detection circuit, 102 is a signal logic value discrimination circuit, and 103 is a reference signal generation circuit. The signal potential detection circuit 101 judges (discriminates) the potential of a received signal level in respect to one or a plurality of prescribed potentials.

The signal logic value discrimination circuit 102 discriminates the potential of a received signal in respect to a reference signal. The reference signal generation circuit 103 has the function of predicting an ideal reference signal potential for next logic value discrimination of an input signal based on the output from the signal potential detection circuit 101 and the signal logic value discrimination circuit 102, and generating the reference signal 11. In this circuit, when a signal transitioning from the low level to the high level is transmitted to a transmission path, and the bit length T is shorter than the time constant $\tau$ of the transmission path, potential at the receiving end is not sufficiently high. However, the low-level signal, which is potential of the one bit previous signal, is stored in the signal potential detection circuit 101, and the reference signal generation means 103 receives this signal and operates so as to set the reference signal potential to a low level, therefore, even if there is signal waveform deterioration at the receiving end, it is possible with a receiving circuit using this approach to establish a logic value discrimination circuit that performs reliable discrimination of the logic value of the input signal.

(Second Embodiment)

Figure 2A:
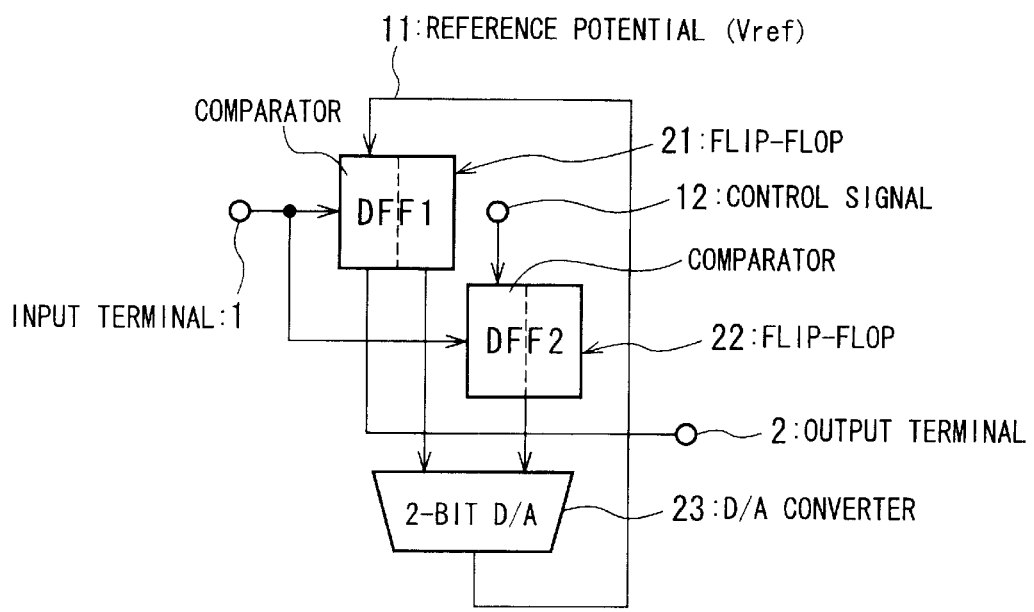
FIG. 2(a) is a drawing showing a second embodiment of the present invention.
Figure 2B:
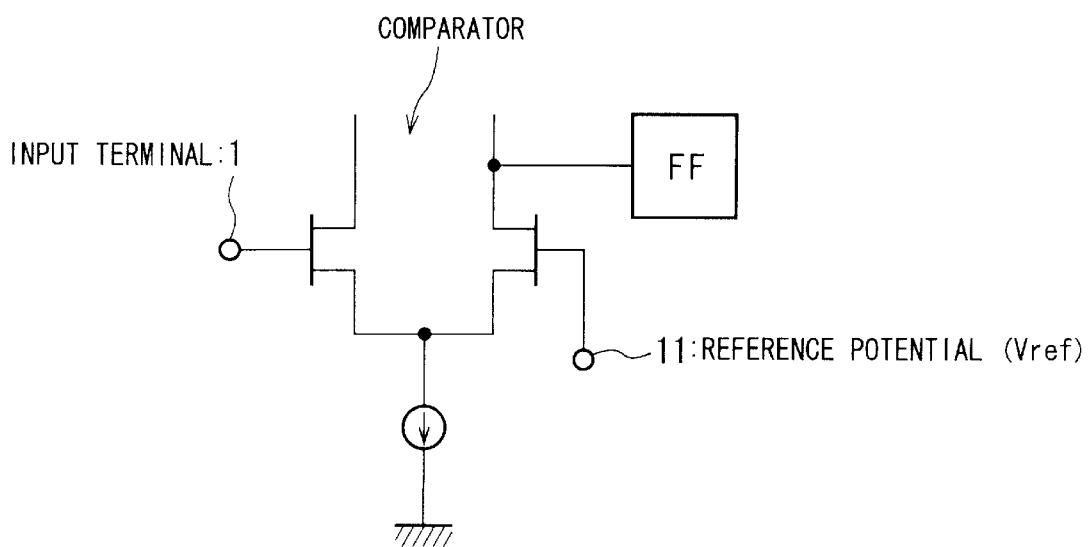
FIG. 2(b) is a drawing showing a input stage of a signal logic value discrimination circuit of the present invention.

FIG. 2 is a drawing showing a second embodiment of the present invention. In FIG. 2, the reference numeral 21 denotes a flip-flop circuit for logic value discrimination circuit, the input stage of which is a differential circuit. The reference signal 11, which serves as the reference for logic value discrimination circuit is obtained from the output of a D/A converter 23 which serves as a reference signal generation circuit. The reference numeral 22 denotes a flip-flop circuit for signal potential detection circuit, this using a differential input stage, the potential of the reference signal is prior set to the center potential of the full-swing signal amplitude. In this configuration, the relationship between an input signal level and the reference signal at each logic value discrimination time is as follows.

In this configuration, it is possible to discriminate four state such as the H level, HM level, LM level, and L level of the input signal based on the two output states (high level and low level) of the logic value discrimination circuit 21 and the two output states (high level and low level) of the signal potential detection circuit 22. Under these conditions, the reference signal levels that can be generated are three levels. Specifically, there is (1) the case in which an output of the signal potential detection circuit 22 and an output of the logic value discrimination circuit 21 are both at the high level, (2) the case in which either one of the signal potential detection circuit 22 or the logic value discrimination circuit 21 is at the high level, the other being at the low level, and (3) the case in which an output of the signal potential detection circuit 22 and the logic value discrimination circuit 21 are both at the low level (these, in accordance with the drawing, being referred to as the RH, RM, and RL levels hereinafter).

Referring to FIG. 3, the case in which the outputs of both the signal potential detection circuit 22 and the logic value discrimination circuit 21 are at the high level is as follows. In this case, the logic value discrimination circuit 21 is at the high level so that the relationships between the logic value and the potential of the reference signal are shown in FIGS. 3(a) to (c).

First, for the case in which the current signal potential is the H level, consider the states that the signal logic value can take at the next time step. If the signal logic value at the next time step is 1, because the signal potential rises above the current potential, the logic value discrimination reference signal remains at the current potential, which is the RH level. In the case in which the signal logic value at the next time step is 0, because in order to perform an accurate logic value discrimination it is necessary for a potential of the logic value discrimination reference signal to be higher than that of the input potential, this remains the same as the current value, which is the highest RH potential (FIG.3 (a)).

In contrast to the above situation, in the case in which the logic value discrimination reference signal is at the RM level and the current signal potential is the high level, the signal potential is higher than the RM level. If the current signal potential is higher than the RH level, and the signal logic value at the next time step is 1, because the signal potential rises above the current potential, it is necessary for a potential of the logic value discrimination reference signal to set to RH level. In the case in which the signal logic value at the next time step is 0, if a potential of the logic value discrimination reference signal is RH level, it is possible to perform an accurate logic value discrimination of the input signal (FIG. 3(b)).

Furthermore, if the current signal potential is greater than the RM level but lower than the RH level, if the signal logic level is 1 at the next time step, because the logic value discrimination reference signal rises, so that it is necessary to set the logic value discrimination reference signal level to the RH level. In the case in which the signal logic level is 0 at the next time step, if the logic value discrimination reference signal level is set to RH level, because the discrimination level is always higher than the input signal potential, there will be no erroneous discrimination of logic level (FIG. 3(c)).

Summarizing the above, in the case in which the outputs of both the signal potential detection circuit 22 and the logic value discrimination circuit 21 are at the high level, it is sufficient to set the reference potential for logic value discrimination at the next time step to the RH level.

Next, referring to FIG. 4, consider the case in which the signal potential detection circuit outputs a high level, and the logic value detection circuit outputs a low level. In this case, the logic value discrimination potential is the RH level, and the current signal potential is the HM level. In this condition, if the signal logic value changes to 0 at the next time step, the signal potential drops, so that the potential of the reference signal must be changed to the RM level. In the case in which the signal logic value is 1 at the next time step, although the signal potential rises, if the logic value discrimination reference signal is set to the RM level, the logic value discrimination reference signal level will always be at a higher potential than the current signal potential, so that erroneous discrimination does not occur.

In the case in which the signal potential detection circuit outputs a low level and the logic value discrimination circuit outputs a high level, as shown in FIG. 5, the logic value discrimination reference signal potential is at the RL level, and the current signal potential is the LM level. In this condition, if the signal logic value is 1 at the next time step, because the signal potential rises to above the RM level, it is necessary to set the signal logic value discrimination reference signal potential to the RM level at the next time step. In the case in which the signal potential is 0 at the next time step, although the signal potential drops, if the logic value discrimination reference signal potential is set to the RM level, the discrimination reference signal level is always higher than the signal potential, so that an erroneous level discrimination does not occur. Summmarizing the above, in the case in which either one of the signal potential detection circuit and the signal logic value discrimination circuit is at the low level, with the other output at the high level, the signal logic value discrimination reference signal level at the next time step should be set to the RM level.

Finally, consider the case in which the outputs of both the signal potential detection circuit and the logic value discrimination circuit are at the low level. First, in the case in which the logic value discrimination reference signal is the RM level and the discrimination result is the low level, the signal potential are the LM level or the L level. Consider the states that the signal logic value can take at the next time step, in the case in which the discrimination reference signal level is RM level and the signal potential is the LM level (FIG. 6(a)). In this condition, if the signal logic value is 0 at the next time step, because the signal potential drops beyond the RL level, the logic value discrimination reference signal potential at the next time step must be set to the RL level. In case in which the signal logic value is 1 at the next time step, however, although the signal potential rises, if the logic value discrimination reference signal is set to the RL level, the logic value discrimination reference signal will always be a lower potential than the signal potential, so that an erroneous level discrimination does not occur (FIG.6 (a)). In the case in which the logic value discrimination reference signal level is at the RM level and the signal potential is a low level, the discrimination reference signal potential must be changed to the RL level (FIG. 6(b)).

In the case in which logic value discrimination reference signal is at the RL level and the discrimination result is the low level, the signal potential is below the RL level. Summarizing this, if both the logic value discrimination circuit and the signal potential detection circuit output a low level, the logic value discrimination reference signal level at the next time step must be set to the RL level (FIG. 6(c)).

Figure 7:
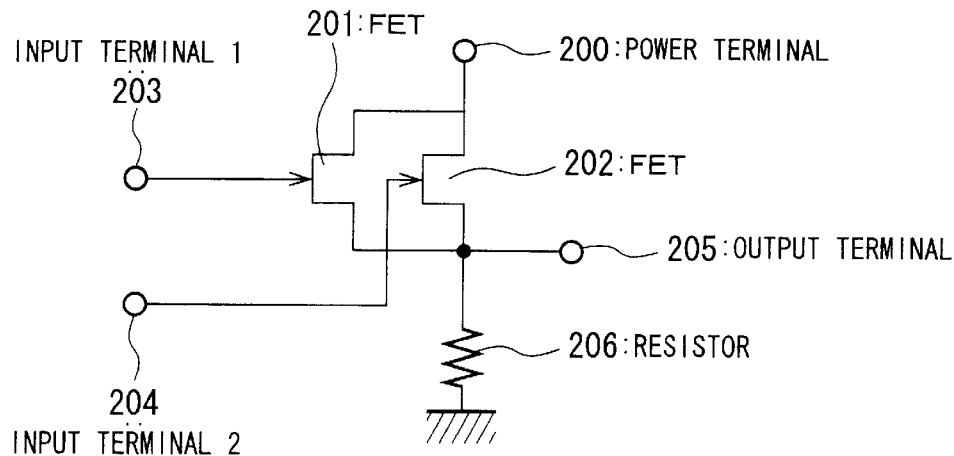
FIG. 7 is a circuit diagram showing an example of a D/A converter used in the present invention.

FIG. 7 shows an example of a D/A converter circuit for generating a reference signal, this being a two-input source follower circuit. In this circuit, the source electrodes of the input FETs 201 and 202 are connected, and the resistor 206 is a load of the FETs 201 and 202. If the input potentials on the two inputs are VIN1 and VIN2, the output potential is VO, the gate width is W, transconductance parameter is K, the threshold voltage is Vt, and a resistance value of resistor 206 is R, and if we assume as a simplification that the drain current of the FETs is proportional to the voltage across the gate and drain, the output of this circuit is shown as follows.

$$Vo=\{(VIN1+Vin2)/2-Vt\}/(1+1/2WKR)\}$$

It can be seen, therefore, that this circuit outputs the average value of the two input voltages. It can be seen that it is possible to make the output potential a prescribed value in response to the input voltages by optimizing the element parameters.

Figure 8:
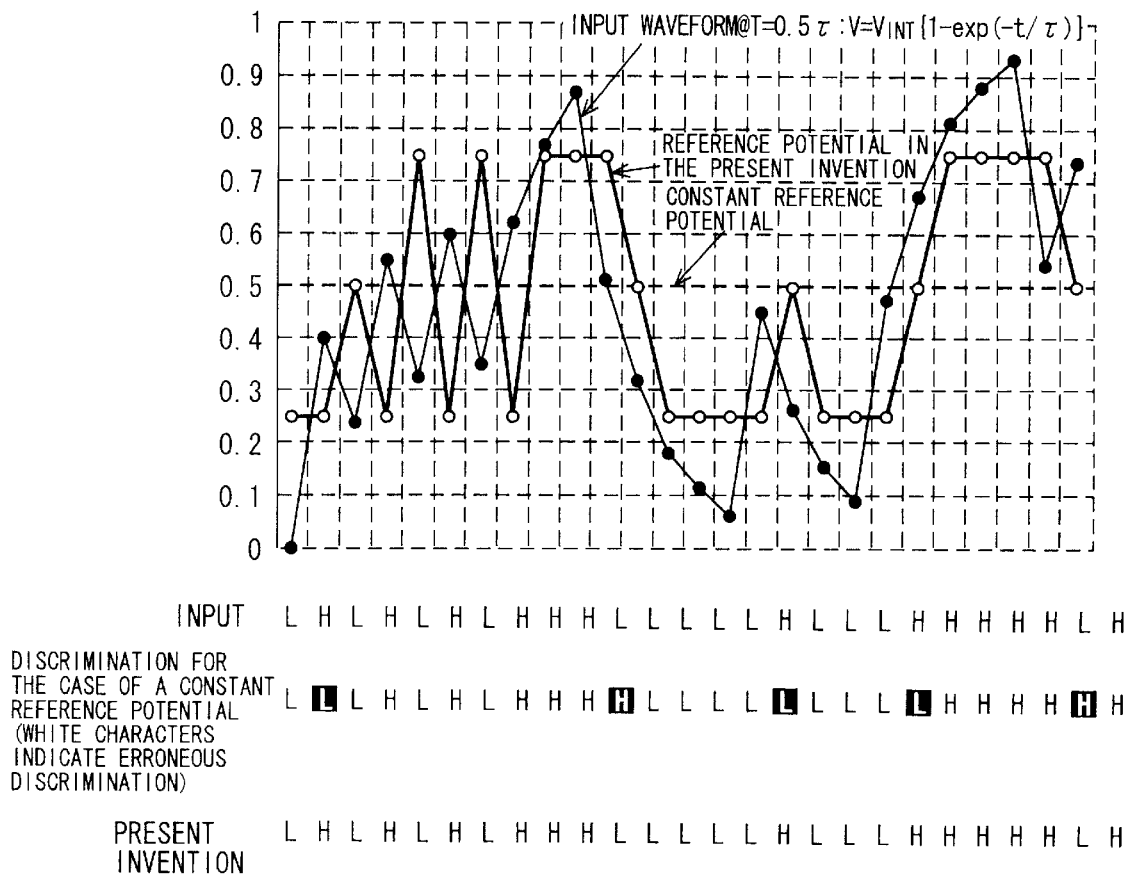
FIG. 8 is a timing diagram illustrating the operation of the circuit of FIG. 2.

FIG. 8 shows a timing diagram illustrating the signal waveform at the receiving end, the logic value discrimination reference signal voltage in the second embodiment of the present invention, the logic value at the transmitting end, and the logic value discriminated by a receiving circuit according to the second embodiment of the present invention, for the case in which transmission medium is approximated by a lumped constant of the time constant τ, and in which the data period T is 0.5τ. It can be seen from this that, although there is considerable deterioration of the signal waveform at the receiving end, by optimizing the potential of the logic value discrimination reference signal, it is possible to receive the signal without erroneous discrimination.

(Third Embodiment)

Figure 9:
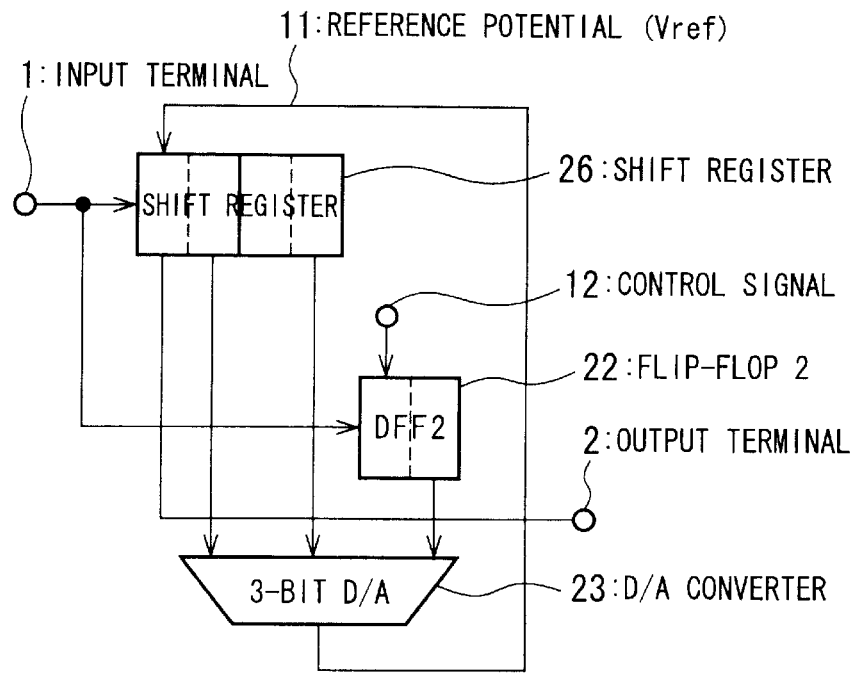
FIG. 9 is a circuit diagram illustration a third embodiment of the present invention.

FIG. 9 shows a third embodiment of the present invention. In FIG. 9, the reference numeral 26 denotes a 2-bit shift register circuit for logic value discrimination, this being implemented by a series connection of flip-flop circuits using differential input circuits.

The reference signal of a logic value discrimination at the initial flip-flop stage is obtained from the output of the reference signal generating D/A converter 23. The reference numeral 22 denotes a flip-flop circuit for detecting the potential of the input signal, this reference potential is set beforehand to the center value of the signal amplitude in the full-swing condition. In this configuration, the relationship between an input signal level and the reference signal at each logic value discrimination time is as follows.

In this configuration, it is possible from the output conditions (high level and low level) of the two output bits of the logic value discriminating shift register circuit 26 and the two output states (high level and low level) of the signal potential detection circuit 22 to perform discrimination that divides signal amplitude in the full-swing condition into 7 divisions. Under these conditions, there are 6 levels that can be generated as reference potential levels. These are (1) the 3 states for the case in which the output of the signal potential detection circuit 22 is at the high level and the both of the two output bits of the discrimination shift register circuit 26 are high level or either one bit of the discrimination shift register circuit 26 is the high level or both of the two output bits of the discrimination shift register circuit 26 are low level and (2) the 3 states for the case in which the output of the signal potential detection circuit 22 is at the low level and the both of the two output bits of the discrimination shift register circuit 26 are high level or either one bit of the discrimination shift register circuit 26 is the high level or both of the two output bits of the discrimination shift register circuit 26 are low level. Compared to the case of the second embodiment of the present invention, in the third embodiment by making a finer division of the logic value levels, application is possible even in the case in which the transmission medium used has poor high-frequency characteristics.

(Fourth Embodiment)

Figure 10:
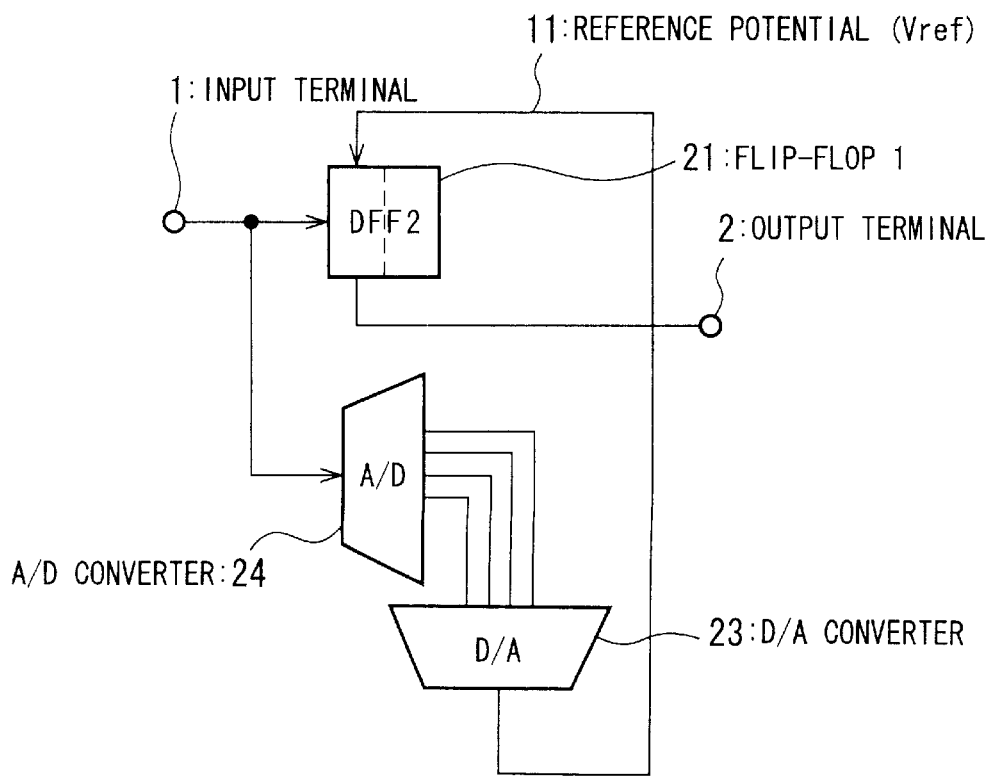
FIG. 10 is a circuit diagram illustrating a fourth embodiment of the present invention.

FIG. 10 shows a fourth embodiment of the present invention. In FIG. 10, the reference numeral 21 denotes a flip-flop circuit for logic value discrimination, 24 is a signal potential detection A/D converter, and 23 is a D/A converter for generation of a reference signal.

Figure 11:
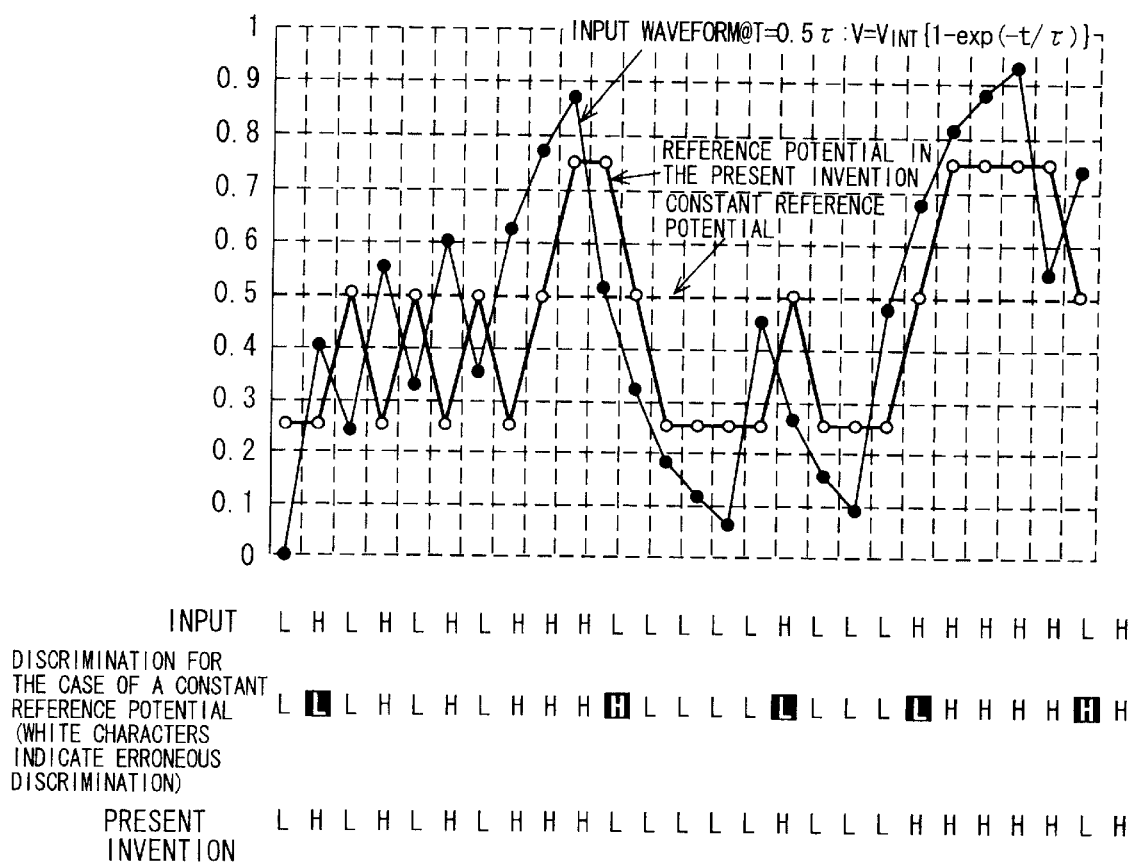
FIG. 11 is a timing diagram illustrating the operating of the circuit of FIG. 10.

In order to perform precise potential detection, it is necessary to increase the number of bits in the A/D converter and D/A converter. FIG. 11 shows the signal waveform at the receiving end of the transmission path, the logic value discrimination reference voltage, the logic value at the transmitting end, the logic values discriminated by this circuit in the fourth embodiment of the present invention. In FIG. 11, a transmission medium is approximated by a lumped constant of the time constant τ, and in which the data period T is 0.5τ. The A/D converter and the D/A converter is assumed to have a number of bits enabling division of the signal amplitude into only 4 divisions. It can be seen from this that, even in the case in which there is considerable deterioration of the signal waveform at the receiving end, because the 1 bit previous potential is used as a reference potential, it is possible to receive a signal without erroneous logic level discrimination. This drawing also shows the logic value discrimination results in the case of a constant reference voltage. The white characters on black background at the bottom of the drawing indicate erroneous discrimination.

(Fifth Embodiment)

Figure 12:
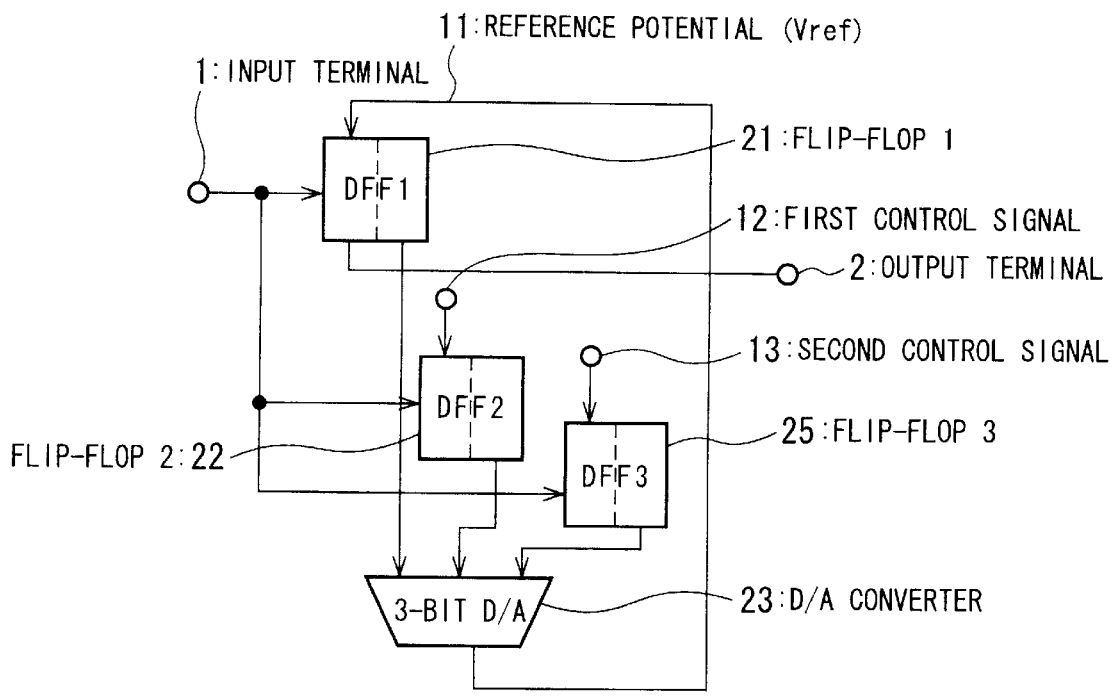
FIG. 12 is a drawing showing a fifth embodiment of the present invention.

FIG. 12 shows a fifth embodiment of the present invention, in which the detection of the signal potential is done using a plurality of flip-flop circuits 22, 25. If the reference signals 12, 13 for the initial stage latch circuit of each of these flip-flop circuits are different each other, it is possible to achieve the same effect as the case of using an A/D converter.

(Sixth Embodiment)

Figure 13A:
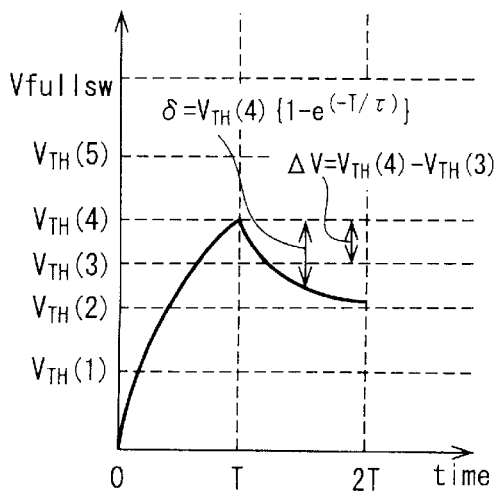
FIG. 13(a)–(b) is a drawing illustrating a sixth embodiment of the present invention.
Figure 13B:
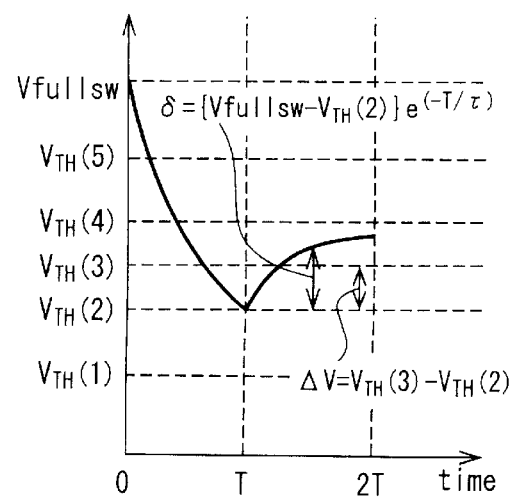
Figure 16:
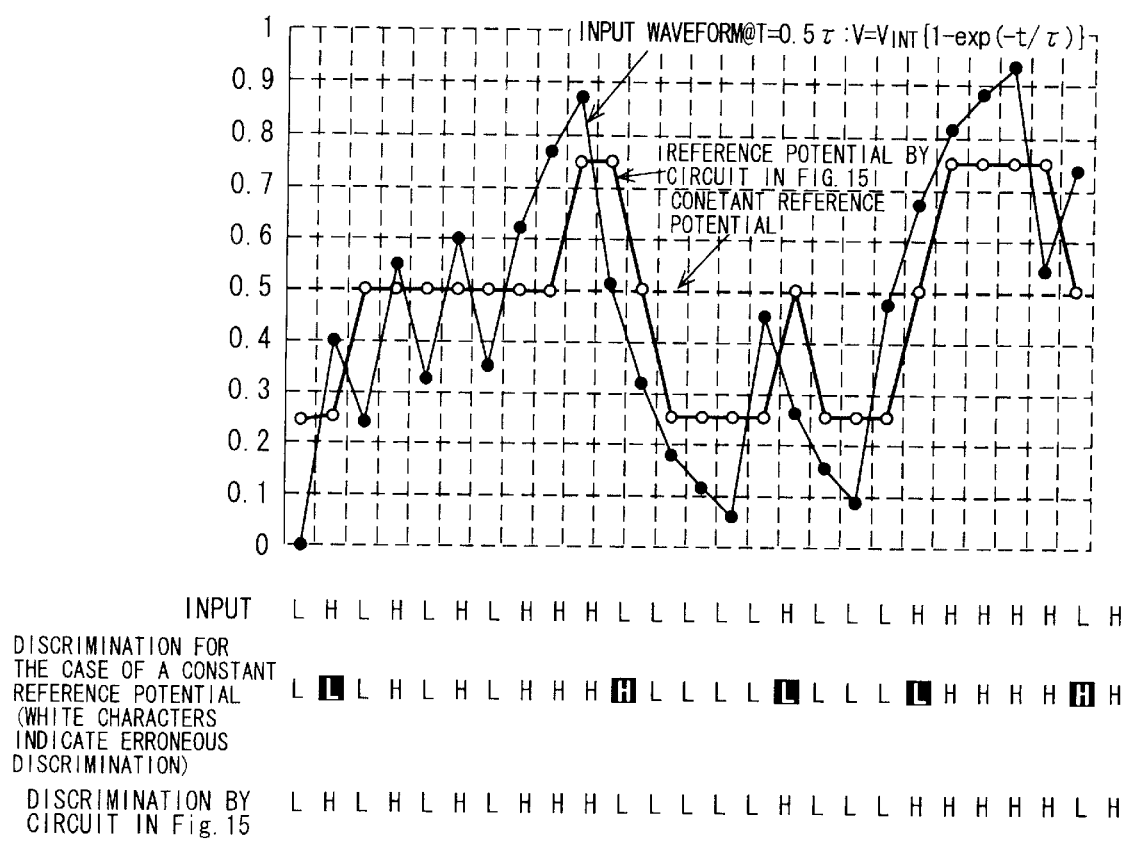
FIG. 16 is a timing diagram illustrating the operation of the circuit shown in FIG. 15.

FIG. 13 illustrates a sixth embodiment of the present invention. In this example, it is assumed that with a full-swing amplitude of the signal as Vfullsw, 5 discrimination levels are provided for logic value discrimination. An error occurs at the logic value discrimination stage in the case in which the change width of the signal potential is smaller than each of the logic level potential changes. In the worst case for each of the logic levels, as shown in FIG. 13(a) and FIG. 13 (b), the potential begins to change from the region of the discrimination level. The amount of change in the signal potential in this case can be calculated for the assumption of a circuit with lumped constants. For example, in the case of FIG. 13 (a), because the signal starts changing from a discrimination level of $V_{TH}(4)$, the amount of change is $\delta=V_{TH}(4)\{1-e^{-T/\tau}\}$. Therefore, the voltage step of the logic value discrimination level must be set so as to be smaller than this amount of change. In the case, however, as shown in FIG. 13 (b), because the signal starts changing from a discrimination level of $V_{TH}(2)$, the amount of change is $\delta = \{Vfullsw - V_{TH}(3)\}e^{-T/\tau}$. Given the above, it is necessary to set the voltage step for logic value discrimination as $\Delta V < \text{Min}.[(Vfullsw - V_{TH}(n))(1-\exp(-T/\tau)), V_{TH}(n)(1-\exp(-T/\tau))]$. In this relationship, n is $1 < n = M-1$, M being the number of change steps in the reference voltage. By making this type of setting, because it is not necessary to make fine setting of unnecessary discrimination levels, not only is it possible to reduce the amount of power consumpyion, but also, because the number of divisions is small, to reduce latency, without the need for a large amount of past data.

By adopting the above-described technical constitution, the present invention is able to minimize the past series of data that is required for accurate signal discrimination, thereby enabling the configuration of a low-power system with little latency. Another effect of the present invention is that achieving cost reduction, by eliminating the need for a high-cost transmission medium requiring a large amount of packaging space.

What is claimed is:

1. A receiving circuit for receiving a signal transmitted to a signal transmission path, said receiving circuit comprising:
   a signal potential detection means for detecting signal potential of said received signal,
   a signal logic value discrimination means for discriminating a logic value of said received signal, and
   a reference signal generation means for generating a reference signal for said signal logic value discrimination means, based on a signal potential detected by said signal potential detection means and a discrimination result of said signal logic value discrimination means.

2. A receiving circuit according to claim 1,
   wherein said signal logic value discrimination means comprising a comparator for comparing a potential of said received signal with that of said reference signal and for discriminating a level of said received signal.

3. A receiving circuit according to claim 1,
   wherein said signal potential detection means holds discriminated logic levels of said received signal from a prescribed past time to the present time, and said reference signal generation means generates a reference potential of said reference signal for performing next logic discrimination of a received signal in said signal logic value discrimination means, based on data stored in said signal potential detection means.

4. A receiving circuit according to claim 1,
   wherein said signal logic value discrimination means holds discriminated logic levels of said received signal from a prescribed past time to the present time, and said reference signal generation means generates a reference potential of said reference signal for performing next logic discrimination of a received signal, based on data stored in said signal logic value discrimination means.

5. A receiving circuit according to claim 1,
   wherein said signal potential detection means holds detected signal levels of said received signal from a prescribed past time to the present time, and said signal logic value discrimination means holds discriminated logic levels of said received signal from a prescribed past time to the present time, said reference signal generation means generates a reference potential of said reference signal for performing next logic discrimination of a received signal in said signal logic value discrimination means, based on data stored in said signal potential detection means and said signal logic value discrimination means.

6. A receiving circuit according to claim 1,
   wherein said signal logic value discrimination means comprising a comparator for comparing said received signal with said reference signal, and a first flip-flop circuit for latching comparison results thereof,
   said signal potential detection means comprising a comparator for comparing said received signal with a fixed potential, and a second flip-flop circuit for latching comparison results thereof, and
   said reference signal generation means comprising a D/A converter for applying weighting to signals output from said first flip-flop circuit and said second flip-flop circuit, and generating a reference potential of said reference signal.

7. A receiving circuit according to claim 1,
   wherein said signal logic value discrimination means comprising a comparator for comparing said received signal with said reference signal, and at least one shift register connected to said first comparator,
   said signal potential detection means comprising a comparator for comparing said received signal with a fixed potential, and a flip-flop circuit for latching comparison results thereof, and
   said reference signal generation means comprising a D/A converter for applying weighting to signals output from said shift register and said flip-flop circuit, and generating a reference potential of said reference signal.

8. A receiving circuit according to claim 1,
   wherein said signal logic value discrimination means comprising a comparator for comparing said received signal with said reference signal, a first flip-flop circuit for latching comparison results thereof, and a plurality of shift registers connected in series to said first flip-flop circuit,
   said signal potential detection means comprising a comparator for comparing said received signal with a prescribed potential, and a second flip-flop circuit for latching comparison results thereof, and
   said reference signal generation means comprising a D/A converter for applying weighting to signals output from said shift registers and said second flip-flop circuit, and generating a reference potential of said reference signal.

9. A receiving circuit according to claim 1,
   wherein said signal logic value discrimination means comprising a comparator for comparing said received signal with said reference signal, and a flip-flop circuit for latching comparison results thereof,
   said signal potential detection means comprising an A/D converter for detecting a level of said received signal, and
   said reference signal generation means comprising an D/A converter for applying weighting to said signal detected by said A/D converter and generating a reference potential of said reference signal.

10. A receiving circuit according to claim 1,
    wherein said signal logic value discrimination means comprising a comparator for comparing said received signal with said reference signal, and a first flip-flop circuit for latching comparison results thereof,
    said signal potential detection means comprising a plurality of prescribed potentials which are different each other, a plurality of comparator for comparing said received signal with said fixed potential, and a plurality of second flip-flop circuits for latching each of said comparison results, and said reference signal generation means comprising a D/A converter for applying weighting to signals output from said first flip-flop circuit and said second flip-flop circuits and generating a reference potential of said reference signal.

11. A receiving circuit according to claim 1, wherein a step width of said reference signal is established to be fine in the vicinity of a center point of an amplitude of said received signal in a full swing condition, and said step width is established to be widened in directions of a lowest value and a highest value.

12. A receiving circuit according to claim 11, wherein, if a step width between said reference signal is $\Delta V$, a number of steps of said reference signal is n, discrimination level of each step is $V_{TH}(n)$ (1<n), a time constant in a case of approximating said signal transmission path with a lumped constant is $\tau$, a data bit length is T, and an amplitude of said received signal in a full-swing condition is Vfullsw, said step width $\Delta V$ and each discrimination level $V_{TH}(n)$ satisfy the following condition, $$\Delta V < \mathrm{Min.}[(V\mathrm{fullsw} - V_{TH}(n))(1-\exp(-T/\tau)), V_{TH}(n)(1-\exp(-T/\tau))].$$

* * * * *